United States Patent [19]

Christopher

[11] Patent Number: 4,901,077
[45] Date of Patent: Feb. 13, 1990

[54] SIGMA-DELTA MODULATOR FOR D-TO-A CONVERTER

[75] Inventor: Todd J. Christopher, Indianapolis, Ind.

[73] Assignee: Thomson Consumer Electronics, Inc., Indianapolis, Ind.

[21] Appl. No.: 182,665

[22] Filed: Apr. 18, 1988

[51] Int. Cl.[4] .......................................... H03M 3/02
[52] U.S. Cl. ..................................... 341/143; 341/77; 341/110; 341/146
[58] Field of Search .................. 341/72, 77, 100, 123, 341/124, 125, 132, 110, 143, 145, 146

[56] References Cited

U.S. PATENT DOCUMENTS

| | | | |
|---|---|---|---|
| 4,087,754 | 5/1978 | Song | 341/77 |
| 4,219,879 | 8/1980 | Judell | 341/110 |
| 4,306,222 | 12/1981 | Peek et al. | 340/347 |
| 4,467,316 | 8/1984 | Musmann et al. | 340/347 |
| 4,600,901 | 7/1986 | Rabaey | 375/28 |
| 4,682,149 | 7/1987 | Larson | 340/347 |
| 4,704,600 | 11/1987 | Uchimura et al. | 340/347 |
| 4,829,299 | 5/1989 | Mandell | 341/77 |
| 4,843,391 | 6/1989 | Lernout | 341/77 |

OTHER PUBLICATIONS

Candy, "Decimation for Sigma Delta Modulation", IEEE Transactions On Comm., vol. COM-34, No. 1, Jan. 86, pp. 72-76.
Candy et al., "A Voiceband Codec with Digital Filtering," IEEE Trans. on Comm., vol. COM-29, No. 6, Jun. 81, pp. 815-830.
Candy, "A Use of Double Integration in Sigma Delta Modulation," IEEE Trans. on Comm., vol. COM-33, No. 3, Mar. 85, pp. 249-258.
Misawa et al., "Simple Chip Per Channel Codec with Filters Utilizing $\Delta$-$\epsilon$ Modulation," IEEE, JSSC, vol. SC-16, No. 4, Aug. 1981, pp. 333-340.
Candy et al., "Double Interpolation for Digital-to-Analog Conversion," IEEE Transactions on Communications, vol. COM-34, No. 1, Jan. 86, pp. 77-81.

Primary Examiner—William M. Shoop, Jr.
Assistant Examiner—Gary J. Romano
Attorney, Agent, or Firm—Joseph S. Tripoli; Eric P. Herrmann; James B. Hayes

[57] ABSTRACT

A digital-to-analog converter includes a sampled data sigma-delta modulator to resample and coarsely quantize the digital samples to be converted. The coarsely quantized samples are converted to sequences of pulses which are applied to a pulse sensitive analog integrator to develop analog representations of the digital signal.

15 Claims, 7 Drawing Sheets

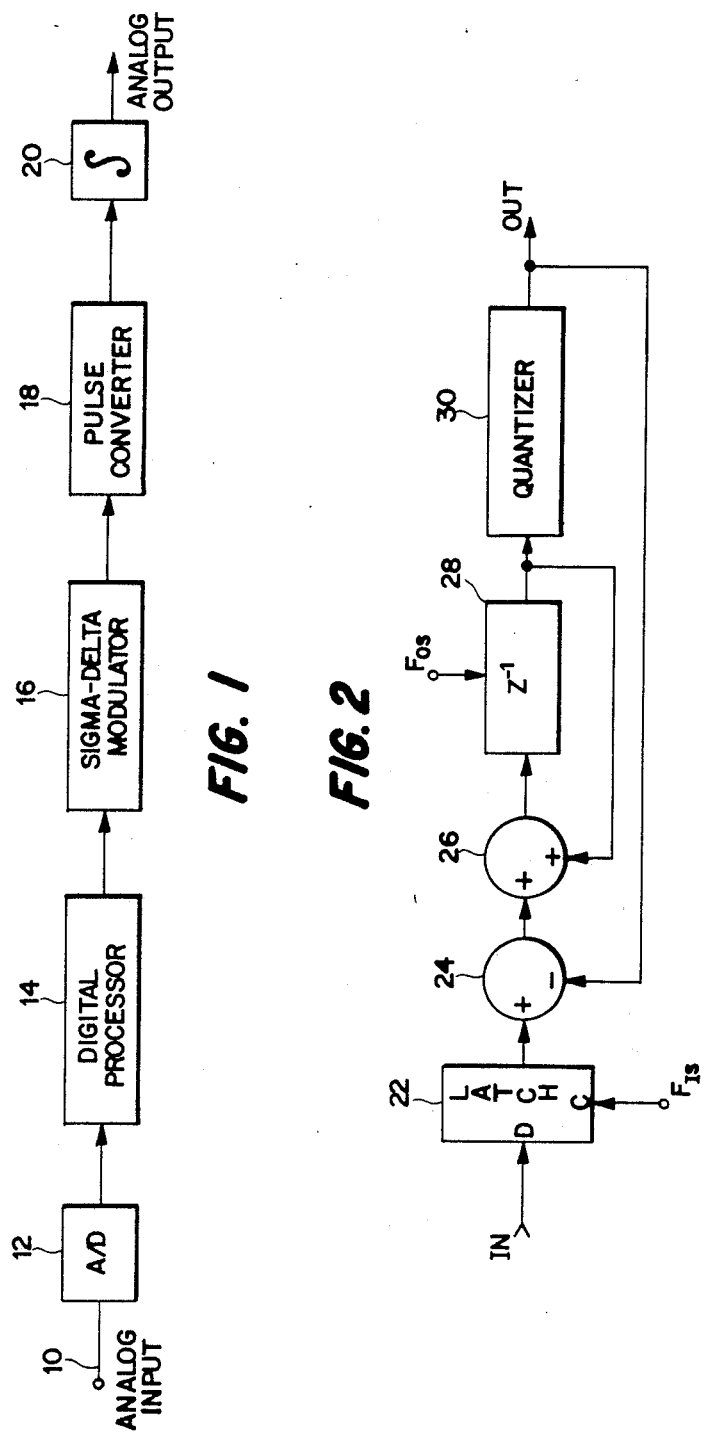

| CELL | | | | VALUE | NOR | NAND | MUX | INV | OUT1 | OUT2 | OUT3 |
|---|---|---|---|---|---|---|---|---|---|---|---|
| 46 | 44 | 42 | 40 | | | | | | | | |
| 1 | 0 | 1 | .X | | 0 | 1 | 1 | 0 | 001 | 00 | 0000 |
| 1 | 0 | 0 | .X | $\leftarrow -1$ | 1 | 1 | 1 | 0 | 001 | 00 | 0000 |
| 1 | 1 | 0 | .X | | 0 | 1 | 1 | 0 | 001 | 00 | 0000 |
| 1 | 1 | 1 | .X | $-1 \leq V \leq 0$ | 0 | 0 | 0 | 0 | 000 | 01 | 0100 |
| 0 | 0 | 0 | .X | $0 \leq V \leq 1$ | 1 | 1 | 1 | 1 | 111 | 10 | 1010 |
| 0 | 0 | 1 | .X | | 0 | 1 | 0 | 1 | 110 | 11 | 1110 |
| 0 | 1 | 0 | .X | $\geq 1$ | 0 | 1 | 0 | 1 | 110 | 11 | 1110 |
| 0 | 1 | 1 | .X | | 0 | 0 | 0 | 1 | 110 | 11 | 1110 |

4,901,077

SIGMA-DELTA MODULATOR FOR D-TO-A CONVERTER

This invention relates to apparatus for digitally processing time varying signals and particularly to apparatus for converting digitally processed signals to the analog domain.

BACKGROUND OF THE INVENTION

This invention will be described in the environment of audio signal processing apparatus, however its utility is not limited to this application. The only limitation on the type of signals that may be processed by the invention relates to the signal bandwidth and the availability of circuit elements having sufficient operating speeds.

It is known to process audio signals using digital circuitry. Typically, such circuitry converts analog audio signals to binary values, arithmetically manipulates the binary values with binary circuitry to perform filtering, tone and volume control functions etc., and then converts the processed binary values back into analog signals for sound reproduction. In order to minimize the circuitry for converting the analog signals to binary values sigma-delta modulators are often utilized. Normally sigma-delta modulators sample the audio signal at a rate which is orders of magnitude greater than the highest audio frequency present. The quantization of the signals provided by the sigma-delta modulator is relatively coarse. Typically the high rate, coarsely quantized samples are filtered and subsampled to create samples having significantly lower quantization error and a manageable sample rate. See for example the articles by James C. Candy entitled "Decimation For Sigma Delta Modulation", IEEE Transactions on Communications, Vol., COM-34, No. 1, Jan. 86, pp. 72-76 and "A Use of Double Integration In Sigma Delta Modulation", IEEE Transactions on Communications, Vol. COM-33, No. 3, March 1985, pp. 249-258. The subsampled signals are processed at the lower rate and then reconverted to analog form. In order to minimize the circuitry for digital-to-analog conversion some such systems resample the processed binary values to a higher rate and to a very coarse quantization level, e.g., to two levels. The coarsely quantized, high rate samples are then integrated/averaged on a capacitor to generate the analog signal. The requantization is performed by a process of interpolation. See for example the article by James C. Candy et al. entitled "Double Interpolation For Digital-to-Analog Conversion, IEEE Transactions on Communications, Vo. COM-34, No. 1, January 1986, pp. 77-81. Interpolation of the type described by Candy et al. incorporates the process of accumulating each processed sample n times where n corresponds to the resampling factor. As such the accumulated values tend to become large requiring relatively large accumulators. In addition, if the binary values are processed in bit-serial format, significant speed constraints are imposed on the processing circuitry due to the high resample rate and the large accumulated values.

It is an object of the present invention to provide simplified digital-to-analog conversion apparatus which obviates processing large accumulated values in the interpolation process.

It is a further object of the invention to provide a bit-serial digital-to-analog converter which operates in pipelined fashion to minimize timing constraints on the overall system.

SUMMARY OF THE INVENTION

The present invention is incorporated in a signal processing system including the cascade connection of an analog-to-digital converter, digital signal processing circuitry and a resampling digital-to-analog converter comprising a sigma-delta modulator and a signal integrator.

An aspect of the invention includes a sigma-delta converter including the parallel connection of a plurality of adder circuits. The carry output terminal of each adder circuit is coupled to the carry input terminal of the adjacent adder circuit. Respective bits of binary samples to be converted are coupled to respective input terminals of the adder circuits. Sum output terminals of the adder circuits coupled to receive the more significant bits of the binary samples are coupled to a quantizer which generates e.g., two-bit samples which are coupled to further input terminals of the adder circuits receiving the more significant bits of the binary samples. The quantized samples are also coupled to a pulse converter means which conditions the quantized samples for application to an analog integrator/averager.

BRIEF DESCRIPTION OF THE DRAWINGS

FIG. 1 is a block diagram of a processing system including a sigma-delta modulator for digital-to-analog conversion;

FIG. 2 is a block diagram of a single loop digital sigma-delta modulator;

DETAILED DESCRIPTION

Figure 3:
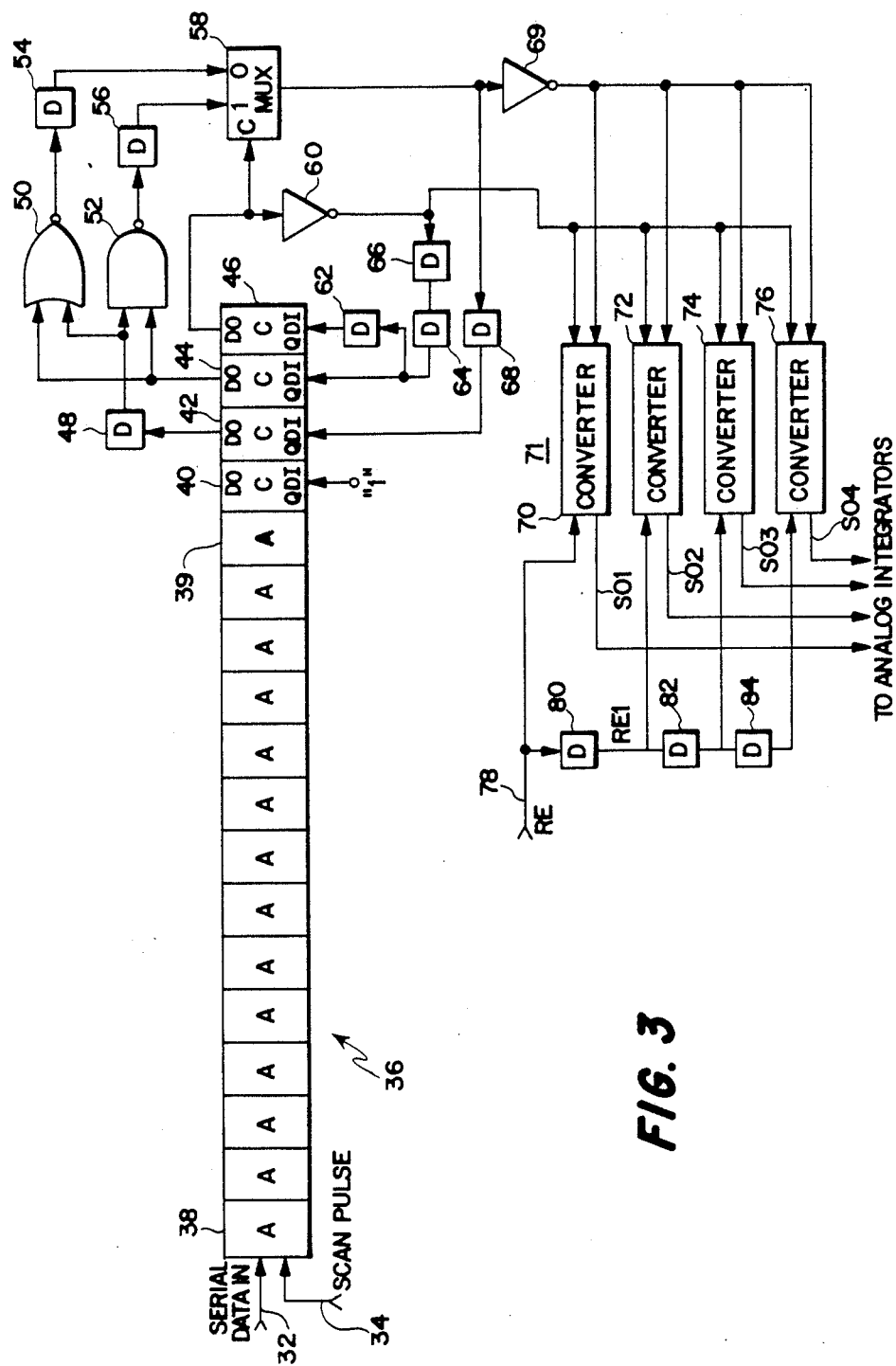
FIG. 3 is a block diagram of a single loop, pipelined, bit-serial sigma-delta modulator.

FIG. 1 illustrates processing apparatus useful for converting an analog signal to digital format, processing the signal digitally, and converting the processed signal back to an analog format. It is desirable to process signals digitally because of the relative parametric stability of digital circuits with aging and temperature variations.

Analog signal applied to terminal 10 is coupled to the input connection of an analog-to-digital converter 12 which develops binary samples representing the analog signal. The binary samples may be in either parallel bit or bit-serial format. The binary samples are coupled to the digital processing circuitry 14. If the signal being processed is an audio signal, processor 14 may include filter and compansion functions as well as elements to perform tone, volume and balance control. The processed binary samples are applied to a sampled data sigma-delta modulator 16 which produces output samples having a greater sample rate and coarser quantization than signal applied to its input. The samples from modulator 16 are applied to a pulse converter 18 which converts the binary samples from modulator 16 to a pulse width modulated signal or a pulse amplitude modulated signal or some other form of signal conducive to being rendered into analog form by relatively simple circuitry such as an integrator/averager 20.

FIG. 2 illustrates a single loop sampled data sigma-delta modulator which may be implemented for element 16 in FIG. 1. In FIG. 2, the processed binary signal is coupled to the data input, D, of the latch circuit 22. The signal is loaded into latch circuit 22 under the control of an input sample clock signal $F_{IS}$ which is synchronous with the occurrence of the input samples. The output of latch circuit 22 is coupled to the cascade connection of a subtractor 24, an adder 26, a one sample delay element 28 and a quantizer 30. The interconnection between the delay element 28 and the quantizer 30 is coupled to a second input connection of adder 26. The output terminal of quantizer 30 is coupled back to the subtrahend input connection of subtractor 24. The delay element 28 is clocked by an output clock signal $F_{OS}$ having a frequency which determines the output sample rate and which typically may be at least an order of magnitude greater than the frequency of the input samples. The combination of elements 24, 26, 28 and 30 forms a conventional sampled data sigma-delta modulator of the type commonly used in analog-to-digital conversion. In the present application, with the inclusion of latch 22 for applying samples at a rate slower than the recursion rate of the modulator, the sigma-delta modulator performs resampling of binary samples to a higher rate to provide coarsely quantized samples for simplified digital-to-analog conversion. The output from the sigma-delta modulator is a sequence of samples having a limited number of values. If the output sample rate $f_{OS}$ is k times the input sample rate $f_{IS}$, over k output sample periods the average value of the output samples approximates the value of the input sample. Over extended periods of time the average value of the output signal is substantially equal to the input signal.

In the specific example to be described with reference to FIGS. 3-5 and 7-11, the presumption is made that the amplitude of the input signal is limited to the range of values of +0.999 to −1. The quantizer, e.g., element 30, provides four values which are illustrated in Table I.

TABLE I

| QUANTIZER INPUT RANGE | QUANTIZER OUTPUT VALUE | BINARY |
|---|---|---|
| IN < −1.0 | +1.5 | 001.1000... |
| −1.0 ≦ IN < 0 | +0.5 | 000.1000... |
| 0 ≦ IN < 1.0 | −0.5 | 111.1000... |
| IN ≧ 1.0 | −1.5 | 110.1000... |

Note that even though the input signal to the modulator is limited to the range of values of +0.9999 to −1.0, the input to the quantizer may be greater than ±1 due to the integrating function of the connection of adder 26 and delay element 28. Second, the output values of the quantizer are in the opposite polarity to the quantizer input values. The output values are provided in inverse polarity so that the function of subtractor 24 may be realized with an adder circuit to simplify the hardware. The polarity of the quantizer output values are effectively inverted in the pulse converter and/or analog integrator/averager to provide the desired analog output signal.

The embodiments of FIGS. 3-5 and 7-11 are designed to process bit-serial samples. In the examples to be described the input sample period is 35 periods of the input sample bit rate, however, the samples are constrained to 15 value bits plus a sign bit and are in two's complement format. The least significant bit occurs first and the sign bit occurs at the sixteenth bit time. The sign bits are extended for the remaining duration of the sample period. The input signal is a time division multiplexed signal consisting of sequences of samples from for example four signals. The format of the input signal is thus of the form S1,S2,S3,S4,S1,S2,S3,S4, S1,S2... where samples S1 and S2 may correspond to left and right stereo signals and signals S3 and S4 may correspond to enhanced left and right stereo signals. FIG. 12 shows the general format of such input signal.

Referring to FIG. 3, the multiplexed, bit-serial input signal is applied to input terminal 32 of a circuit element 36. Element 36, consisting of cells A and C, performs the functions of elements 22-28 in FIG. 2. The logic circuitry coupled to the right hand end of element 36 corresponds to quantizer 30. The respective bits of a bit-serial sample are sequentially loaded into the respective cells with the least significant bit (LSB) being loaded into the leftmost A cell 38, the most significant value bit being loaded into the C cell 40, and extended sign bits being loaded into C cells 42, 44 and 46. The loading of respective bits into successive cells is controlled by a scan pulse applied to terminal 34. In the exemplary embodiment, the scan pulse occurs once per input sample period, is one bit period in duration, and occurs during the bit time immediately preceding the occurrence of the LSB of each sample.

For the samples as defined, the binary point occurs between cells 40 and 42. As the functional response of the quantizer has been defined, only the integer part of the samples processed by element 36 need to be examined by the quantizer to develop the quantizer output samples. In the example of FIG. 3, the integer part of each processed sample is represented by the output bits from cells 42, 44 and 46. Referring to Table I, it is seen that the binary output samples provided by the quantizer have three variable bits in the integer positions, a logic "one" valued bit in the bit position immediately to the right of the binary point and zero valued bits in all remaining bit positions. All of the lesser significant bits being zero valued, they need not be included in the feedback path for combining with the input sample since adding or subtracting zero valued bits to an input sample will not change the sample. Since the quantizer output bit immediately to the right of the binary point is always a logic one value, a constant one value is coupled back to this bit position in element 36, which bit position corresponds to cell 40. In FIG. 3 this logic one is shown coupled to the quantized data input (QDI) terminal of cell 40. The exemplary quantizer is designed to provide only the three more significant variable integer bits which are respectively coupled to cells 42, 44 and 46 of element 36.

The sample bits, for a particular sample, output by cells 42, 44 and 46 occur sequentially. That is, the most significant bit (MSB) of sample $S_i$ is output from cell 46 one bit period after the second MSB of sample $S_i$ is output from cell 44 which in turn is output one bit period after the third MSB of sample $S_i$ is output from cell 42, etc. In order to time align the three MSB's of respective samples for detection by the quantizer, delay elements 48, 54 and 56 are included in the quantizer circuitry. Delay elements 48, 54 and 56 each provide a delay of one-bit-period. Delay element 48 coupled to the data output, DO, of cell 42 time aligns the sample bit provided by cell 42 with the sample bit available at the output DO from cell 44. The sample bit from delay element 48 is coupled to first input terminals of NAND gate 52 and NOR gate 50. The sample bit from cell 44 is coupled to second input terminals of NAND gate 52 and NOR gate 50. The output terminals of the NAND gates are respectively coupled to delay elements 56 and 54 which time align the intermediate detected results of the sample bits from element 48 and cell 44 with the sample bit from cell 46. The output terminals of delay elements 54 and 56 are respectively coupled to first and second input terminals of a two-to-one multiplexer 58. Multiplexer 58 is controlled by the output of cell 46 to provide the output signals from delay elements 56 or 54 depending on whether the output from cell 46 is a logic one or zero respectively.

The output bit from cell 46 is applied to an inverter 60 which complements this bit. The output of multiplexer 58 is coupled to the quantized data input terminal (QDI) of cell 42 via a one-bit-period delay element 68. The output of inverter 60 is coupled to the QDI terminal of cell 44 via one-bit-period delay elements 64 and 66 and to the QDI terminal of cell 46 via one-bit-period delay elements 62–66. Delay elements 62–68 are incorporated to provide delay compensation for the processing delays of the C cells so that the appropriate quantizer output samples are appropriately time justified and combined with the appropriate one of four time division multiplexed samples.

The output from the quantizer which is fed back to element 36 is a two bit sample. Table I indicates that the desired quantizer output is a four bit sample. As indicated previously, the first bit to the right of the binary point is a constant one value and this value is hard wired to cell 40. The third MSB of the quantizer output (Table I) is provided by multiplexer 58. The first and second MSB's are equal for all quantizer output values. These two bits are both provided by inverter 60.

Figures 11, 14:
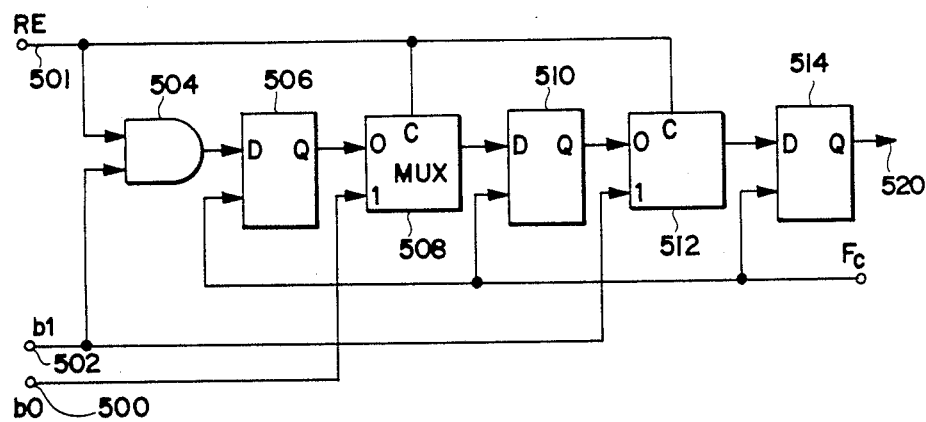
FIG. 11 is a logic schematic diagram of a pulse converter.
FIG. 14 is a table of logic values describing the logical operation of the quantizer used in the FIG. 3 and FIG. 7 circuitry.
Figure 12:
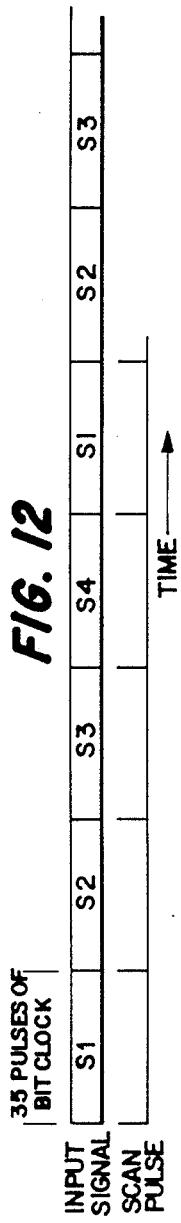
FIG. 12 is a timing diagram of a time division multiplexed signal.

The operation of the quantizer is logically indicated in FIG. 14. In FIG. 14, the columns designated 40–46 represent all possible combinations of bit values for the three MSB's of each sample available from cells 42, 44 and 46. The values in the columns 42–46 are assumed to be time aligned, i.e., the bit values under columns designated 42 and 44 represent bit values from cells 42 and 44 which have been delayed by two and one bit periods respectively relative to bit values from cell 46. The column designated VALUE indicates the range of values an entire sample may assume having the particular three MSB's indicated in columns 42–46. The columns designated NOR and NAND represent the logic output values of NOR and NAND gates 50 and 52 for logic input value pairs defined by columns 42 and 44. The columns designated MUX and INV represent the output values of elements 58 and 60 responsive to the values listed in columns NOR, NAND and 46. The column designated OUT1 is the two's complement value fed back from elements 58 and 60 to element 36. These values were determined by concatenating the inverter output value INV with a duplicate of itself and then concatenating the multiplexer output bit MUX thereto. The column OUT2 represents the two bit quantizer output values which are applied to the pulse converter.

The leftmost bit, MSB, of each of these samples, OUT2, is equal to the logic value, INV, provided by inverter 60 and the rightmost bit (LSB) is equal to the complement of the multiplexer output, MUX, provided via inverter 69. The bit patterns in column OUT1 and OUT2 are parallel bit samples. The bits of samples OUT1 are effectively placed in pipelined format by the operation of delay elements 62–68.

Figures 4, 5, 6:
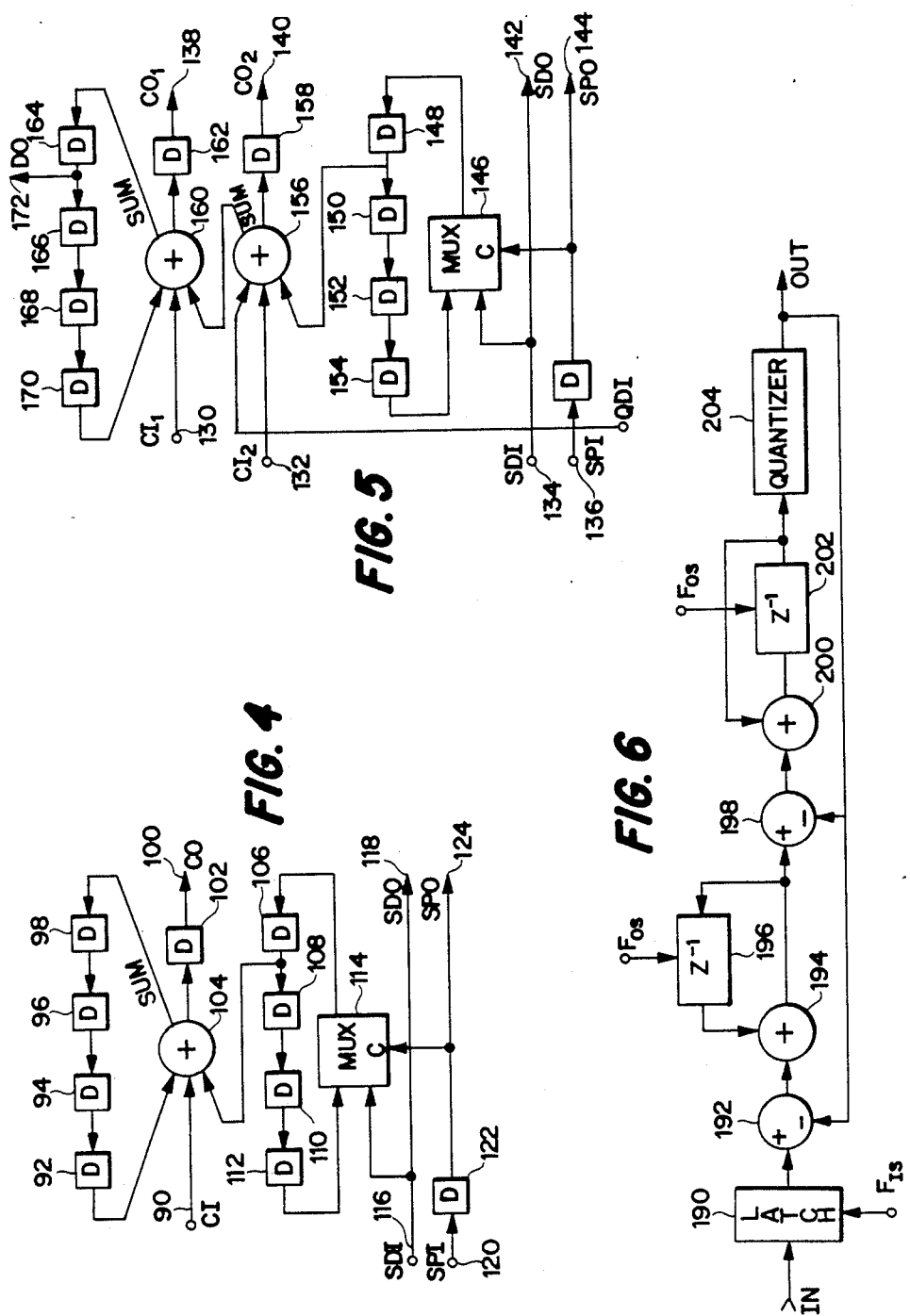
FIGS. 4 and 5 are schematic diagrams of respective blocks of the FIG. 3 apparatus.
FIG. 6 is a block diagram of a double loop sigma-delta modulator.

The A cell of FIG. 3 is illustrated in detail in FIG. 4 and the C cell is illustrated in detail in FIG. 5. In FIG. 4, elements 92–98, 102, 106–112 and 122 are single bit delay stages. These delay stages are controlled by a system clock $F_c$ (see FIG. 14) and each of which provides a delay of one period of clock $F_c$ (equal to one bit period). Each of the A cells includes a serial data input, SDI, and a serial data output, SDO, terminal which are interconnected and coupled to one signal input terminal of a multiplexer 114. The cell includes a scan pulse input, SPI, and a scan pulse output, SPO, terminal interconnected via delay element 122. The SPO is also coupled to the control input of the multiplexer 114. A scan pulse coupled to the SPI terminal is coupled to the control input of multiplexer 114 one bit period after being applied to the SPI. The output terminal of multiplexer 114 is coupled to a second input terminal of multiplexer 114 through the cascade connection of delay elements 106, 108, 110 and 112. The A cell further includes an adder having an addend input terminal coupled to the output terminal of multiplexer 114 via delay element 106. The adder includes a carry input terminal, CI, a carry output coupled to a carry output terminal, CO, via delay element 102, a sum output and an augend input. The sum output is coupled to the augend input through the cascade connection of delay elements 92, 94, 96 and 98.

Each A cell is a one bit time division multiplexed accumulator. In operation, the ith bit of four successive input samples are resident in respective delay elements 106–112. These bits recirculate synchronously with clock $F_c$ and are sequentially coupled to the addend input of the adder 104. The sum output values produced by adder 104 are synchronously coupled back to its augend input. Since there are equal delays in the recirculating loop and in the adder output-input connection, whenever a bit of a particular sample is coupled to the addend input the corresponding accumulated sum is concurrently coupled to the augend input.

The A cells are connected in parallel with the CO, SDO and SPO terminals of each A cell being respectively coupled to the CI, SDI and SPI terminals of the next adjacent cell. The carry in terminal, CI, of the leftmost A cell, 38, is coupled to a logic zero value. The serial data input terminal, SDI, of the leftmost A cell is coupled to the data input terminal 32. The scan pulse input terminal, SPI, is coupled to a terminal 34.

The C cell (FIG. 5) is similar to the A cells insofar as it contains a recirculating loop including multiplexer 146 and delay elements 148–154; a one bit accumulator including adder 160, feedback delay elements 164–170; and carry input and output terminals $CI_I$ 130 and $CO_1$ 138; serial data input and output terminals SDI 134 and SDO 142; and scan pulse input and output terminals SPI 136 and SPO 144. The C cell differs from the A cell because it is required to perform both the accumulation function of the A cell and also to perform the subtraction function indicated by subtractor 24 in FIG. 2 (i.e., one bit of the subtraction function). In order to perform the subtraction function, an additional adder, 156, is required which is interposed between the recirculating loop and the addend input of adder 160. The augend input of adder 156 is coupled to a quantized data input terminal QDI, to which signal from the quantizer output is applied. The adder 156 has a carry input ($CI_2$) terminal 132, and a carry output which is coupled to a carry output ($CO_2$) terminal 140 via a delay element 158. The C cell also includes a sum data output (DO) terminal 172, which is coupled to the adder 160 via delay element 164, to provide the more significant bits of the processed samples to the input terminals of the quantizer.

The C cells are connected in parallel with the $CO_1$, $CO_2$, SDO and SPO terminals of respective cells coupled to the $CI_1$, $CI_2$, SDI and SPI terminals respectively of the next adjacent cell. Input terminals $CI_1$, SDI and SPI of C cell 40 are respectively coupled to the output terminals CO, SDO and SPO of A cell 39. Input terminal $CI_2$ of cell 40 is coupled to a logic zero value.

The A cells and the C cells of FIGS. 4 and 5 are shown with a one bit period delay element between the respective adders and the CO terminals. This delay element may be relocated to reside between the CI terminals and the respective adder. Alternatively if there is an inherent one bit delay between application of signals to the adder input terminals and the production of a carry out signal it may be eliminated entirely.

Operation of element 36 will be described with reference to FIGS. 12 and 13. The input samples are time division multiplexed samples from four signals as indicated in FIG. 12. Thus every fourth input sample represents the same signal. The input signal bit-serial format is illustrated by the timing blocks designated SERIAL INPUT in FIG. 13. Such sample includes 15 value bits designated 1-15 and 20 sign bits designated S all of which are a replication of the sample sign bit occurring at the 16th time block designated sign bit. In actuality the bit values of the lastmost 17 bit periods need not be defined since element 36 having a total of 18 cells can only accommodate the first 18 bits. The bit-serial samples are applied to the SDI terminal of the leftmost A cell 38.

A sample bit demultiplexing signal (Scan Pulse) is coupled to the SPI terminal of the leftmost A cell. This signal contains one pulse per sample interval, which pulse is one bit period or less in duration and occurs one bit period prior to the occurrence of the LSB of respective input samples. The scan pulse, delayed by one bit period in delay element 122, occurs at the control input terminal of multiplexer 114 concurrently with the occurrence of the LSB of the input sample at the signal input terminal of multiplexer 114, and conditions multiplexer 114 to load the LSB of the new sample into delay element 106. For the next successive 34 bit periods multiplexer 114 is conditioned to recirculate data in the delay elements 106–112. During the occurrence of the second most LSB of the input sample, the scan pulse occurs at the control input terminal of multiplexer 114 of the second A cell and the second most LSB is loaded into delay element 106 of the second A cell. In similar manner the remaining sample bits are successively loaded into the successive A cells and C cells of element 36. The loading of the respective sample bits into the cells of element 36 is performed in a pipelined fashion. Similarly the accumulation of all of the bits of a sample is performed in pipelined fashion. A one bit time delay occurs between the inputting of a bit to a cell and the occurrence of a carry out signal corresponding to an accumulation performed on that bit. Thus, when the nth bit of a sample is applied to the nth cell, the carry out signal, from the (n−1)th cell occurs concurrently for combination with the nth bit in the nth cell. Accumulation of the sample bits progresses along the cells with the inputting of sample bits.

At the 35th bit time another scan pulse occurs, and during the 36th bit time the LSB of the next subsequent sample occurs. During the 36th bit time, multiplexer 114 of A cell 38 is conditioned to load this LSB into delay element 106. Because there are four delays in the recirculation loop and 35 bit times per sample, the LSB of the former sample has precessed to delay stage 112, thus there is no mixing of sample bits from different ones of the time division multiplexed signals. The respective bits of the second sample are successively loaded into the successive cells of element 36.

At the 70th bit time another scan pulse occurs, and at the 71st bit time the LSB of the third sample occurs at terminal SDI of A cell 38. During the 71st bit time this LSB is loaded into delay element 106. Due to the aforementioned precession of sample bits in the recirculating loop, at the 71st bit time, the sample bits from the first and second samples are resident in delay elements 110 and 112 respectively so no signal mixing occurs. Note that the precession similarly occurs in all of the cells in element 36 to maintain bits from the separate signals distinct.

During the next subsequent sample period sample bits from the fourth signal are loaded in element 36.

At the 140th bit time the LSB of a fifth sample occurs at the SDI terminal of A cell 38 and is loaded into delay element 106. The fifth sample is the second sample of the same signal represented by the first sample. The fifth sample replaces the first sample in the delay element 106 of the recirculating loop. Similarly the subsequently occurring sixth, seventh and eighth samples replace the second, third and fourth samples in the delay elements of the recirculating loop.

During every bit period one of the four bits contained in each of the A cells undergoes an accumulation process and one of the four bits contained in each of the C cells undergoes a differencing and an accumulation process. Since input samples for a particular signal are replaced every four sample periods, each sample undergoes one-fourth of 4 times 35 or 35 accumulation processes. Thus in the illustrated example the resampling rate for each of the time division multiplexed signals is 35 times the input rate.

After the first four sample periods, the apparatus of FIG. 3 produces a valid resampled output sample each bit time. The oversampled output samples are time division multiplexed similar to the input signal. The format of the quantizer output is illustrated by the timing blocks designated QO in FIG. 13.

The output samples from the quantizer are coupled to the pulse converter 71 which demultiplexes the four signals S1–S4 and converts the parallel bit quantizer output samples to bit-serial samples having 0, 1, 2 or 3 logic one values or pulses per sample, depending on the quantizer output being +1.5, +0.5 or −1.5 respectively. The output pulses are applied to a pulse sensitive analog integrator/averager to produce the analog output signal. The larger the number of pulses per bit-serial sample applied to the analog integrator/averager, the more positive the integrated analog output value. As stated immediately above, a greater number of bit-serial sample pulses are associated with the more negative quantizer output values. However it should be remembered that the quantizer was designed to provide the opposite polarity quantized values to facilitate the subtraction process in element 86 by use of an adder rather than a subtractor.

In FIG. 3, the pulse converter 71 consists of four parallel converters 70–76 each having input terminals coupled to the quantizer output. The four converters are conditioned during successive bit times to accept exclusive sequences of every fourth sample from the quantizer. For example, converter 70 accepts only the S1 samples and converter 72 accepts only the S2 samples. The respective converters are successively strobed by a signal RE applied to terminal 78. The signal RE is coupled to cascade connected delay elements 80, 82 and 84, wherein it is successively delayed by units of one bit time and coupled to the respective converters.

Figure 13:
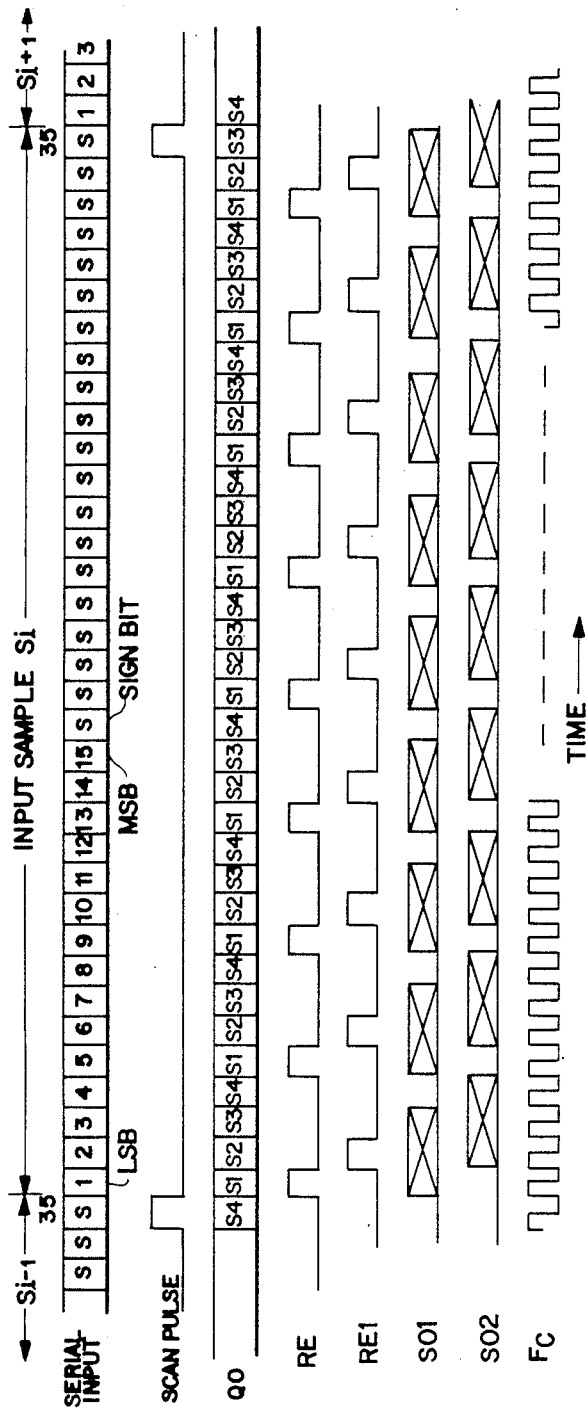
FIG. 13 is a timing diagram useful in describing the operation of the FIG. 3 and FIG. 7 circuitry.

The signal RE which is coupled directly to converter 70 is illustrated in FIG. 13. The delayed replica RE1 of signal RE applied to converter 72 is also illustrated in FIG. 13 as well as the timing of the bit-serial output samples SO1 and SO2 provided by converters 70 and 72.

FIG. 11 is an exemplary embodiment of one of the converters 70–76. The output sample bits from the quantizer are designated b0 and b1. Bit b1 is the more significant bit and thus carries twice the weight of the lesser bit b0. To conveniently differentiate the weighting differences the bit b0 is complemented in inverter 69 and the samples b1$\overline{b0}$ are applied to the circuitry of FIG. 11. The respective samples b1$\overline{b0}$ are listed in column OUT2 in FIG. 14.

Referring to FIG. 11, when a pulse RE occurs at terminal 501, the bits b1$\overline{b0}$ of the concurrently occurring quantizer sample are loaded into the circuit. Thereafter the quantizer output is effectively disconnected until the occurrence of the next pulse RE which occurs three bit times later. The bits loaded into the circuitry are sequentially read out of the circuitry to produce the desired bit-serial output stream at terminal 520.

Bit b1 is applied to terminal 502 which is coupled to one input of AND gate 504 and the "1" data input of multiplexer 512. Bit $\overline{b0}$ is coupled to the "1" data input of multiplexer 508. Signal RE is applied to terminal 501 which is coupled to a second input of AND gate 504 and to the control inputs of multiplexers 508 and 512. The output of AND gate 504 is coupled to the data input of D type latch 506 the output of which is coupled to the "0" data input of multiplexer 508. The output of multiplexer 508 is coupled to the data input of D type latch 510 the output of which is coupled to the "0" data input of multiplexer 512. The output of multiplexer 512 is coupled to the data input of D type latch 514 the output of which provides the bit serial output samples. When signal RE is high multiplexers 508 and 512 are conditioned to couple their respective "1" data input terminals to their respective output terminals and conditions AND gate 504 to pass the logic value of bit b1. Thus when signal RE is high bit b1 is loaded into latch 506 and latch 514 and bit $\overline{b0}$ is loaded into latch 510. Loading of latches is effected by the clock signal $F_c$ applied to respective clock input terminals, C, of the respective latches. When signal RE subsequently goes low multiplexers 508 and 512 are conditioned to form the cascade connection of latches 514, 510 and 506. Clock signal $F_c$ thereafter sequentially clocks the data held in latches 510 and 506 to terminal 520. Because bit b1 is loaded into two latches and bit $\overline{b0}$ is loaded into only one latch the weighting of bit b1 is doubled with respect to bit $\overline{b0}$. If one applies the bit values listed in column OUT2 of FIG. 14 and traces the bits through the circuitry of FIG. 11, it will be seen that the corresponding bit-serial output values equal the sample values listed in the column designated OUT3 in FIG. 14.

FIG. 6 illustrates a conventional two loop sampled data sigma-delta modulator including the cascade connection of a subtractor 192; a first accumulator including adder 194 and delay element 196; a second subtractor 198; a second accumulator including adder 200 and delay element 202; and a quantizer 204. Similar to the single loop modulator of FIG. 2 this circuitry includes an input latch 190 which operates at the input sample rate while the remainder of the modulator operates at the resample rate. The two loop sigma-delta modulator is desirable because it produces output values with a greater signal to noise ratio than the single loop type.

Figure 7:
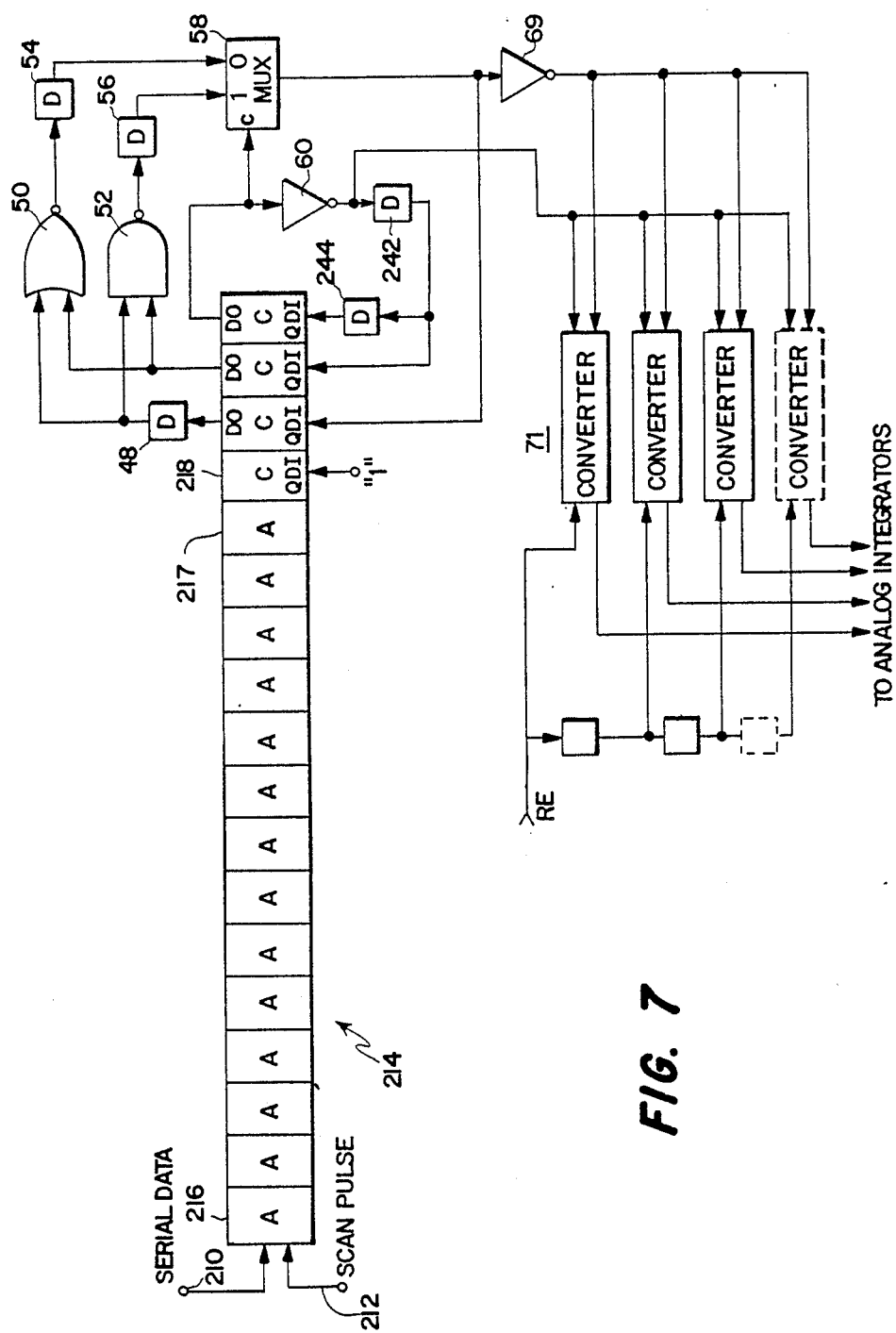
FIG. 7 is a block diagram of a double loop, pipelined, bit-serial sigma-delta modulator.

FIG. 7 illustrates a block diagram of a bit-serial two loop modulator. The FIG. 7 apparatus differs from the FIG. 3 single loop circuitry in two respects. First the A cells and the C cells differ from the A cells and C cells described with respect to FIGS. 4 and 5. Secondly, there are only two delay elements 242 and 246 coupled between the output of the quantizer and the quantized data input terminals, QDI, of the respective C cells. Fewer delay elements are required because of the greater inherent processing delay within the C cells. The quantizer per se operates identically to the quantizer described with reference to FIG. 3. In addition, the operation of the pulse converter 71 is the same as in FIG. 3. Finally the general operation of the A and C cells regarding the pipelining of input bits and the pipelining of sample accumulation is basically the same as in the FIG. 3 circuitry.

Figure 8:
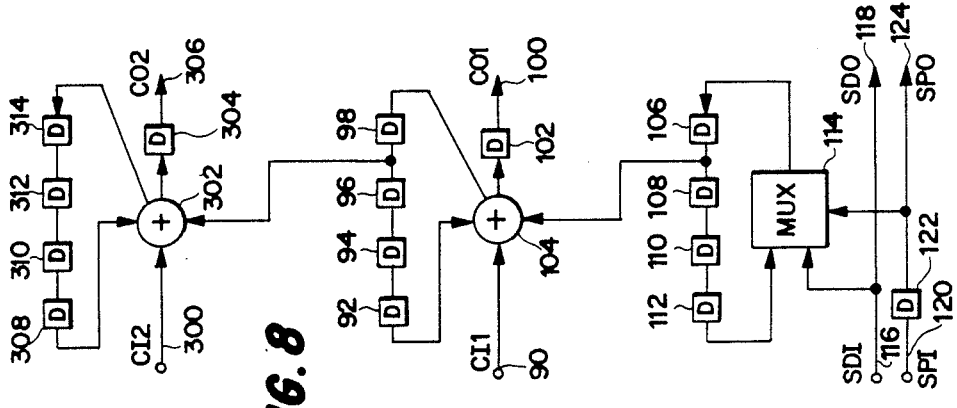

FIG. 8 illustrates the A cells utilized in the FIG. 7 circuitry. In FIG. 8, the circuit elements designated with the same numbers as elements in the FIG. 4 circuit are identical and function in like manner. This circuitry performs the function of the first accumulator in the two loop circuit. A second one bit accumulator is realized in the A cell of FIG. 8 with the inclusion of adder 302 having an addend input coupled to the sum output of adder 104 via delay element 98. The augend input of adder 302 is coupled to its output through the cascade connection of four one-bit-period delay elements 308, 310, 312 and 314. Adder 302 also has a carry input coupled to a carry input terminal $CI_2$ and a carry output coupled to a carry output terminal $CO_2$ via a one-bit period delay element 304. The elements 300–314 operate identically to elements 90–104. However because of the additional processing delay inherent in the circuitry of elements 300–314, the output bits provided by the carry out terminals $CO_1$ and $CO_2$ do not concurrently represent the same sample. Rather the carry output available on terminal $CO_2$ represents the sample available at the carry output terminal $CO_1$ during the immediately previous bit period. This delay between carry outputs $CO_1$ and $CO_2$ facilitates the pipelined operation of interconnected A cells and C cells.

Figure 9:
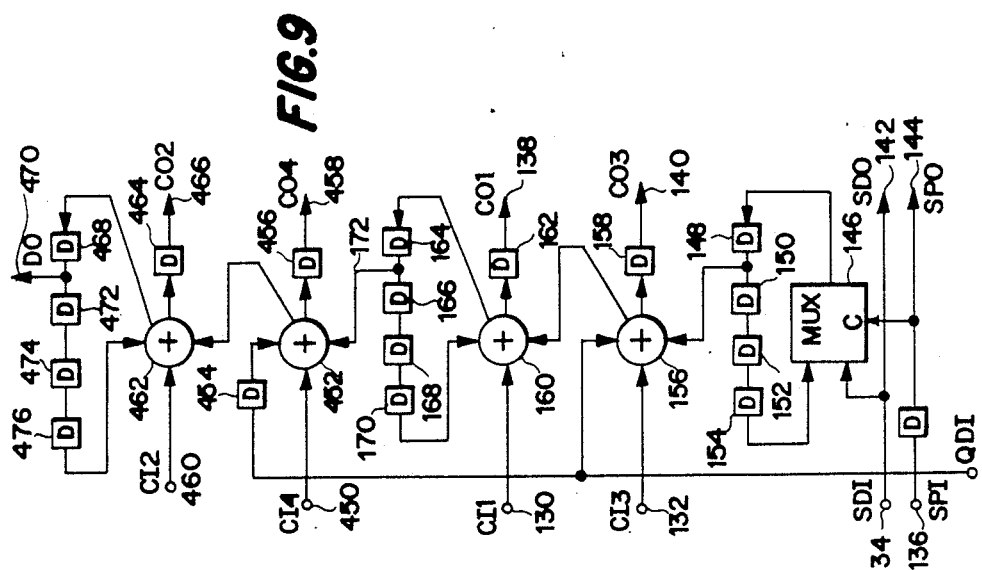
FIGS. 8, 9 and 10 are schematic diagrams of respective blocks of the FIG. 7 apparatus.

FIG. 9 illustrates an embodiment of the C cells utilized in the FIG. 6 circuit. In FIG. 9 elements, designated with the same numbers as elements in FIG. 5 are identical and perform the same function. In order to perform the second subtraction corresponding to subtractor 198 and the second accumulation corresponding to elements 200 and 202 of FIG. 7, the elements coupled above delay elements 164–170 are included. The second subtraction is accomplished by adder 452 adding the inverse polarity quantizer output to the sum output from the first accumulator available on connection 172. The second accumulation is performed by elements 460–476 coupled to the sum output of adder 452 and operating in like manner as elements 160–170. The adder 452 is coupled to the QDI terminal through a one-bit-period delay element 454 to accommodate the processing delay incurred between the addend input of adder 156 and accumulator output connection 172. Note the elements 450–476 perform similarly to the elements 156–172, with the exception that the results of the latter elements occur one bit period prior to the former elements to facilitate pipelined operation.

The A cells and the C cells are respectively interconnected with their $CO_i$ terminals coupled to the $CI_i$ terminals of the adjacent cell, and the SDO and SPO terminals coupled respectively to the SDI and SPI terminals. The $CI_1$ and $CI_2$ terminals of A cell 216 are connected to logic zero potential. The $CI_3$ and $CI_4$ terminals of C cell 218 are coupled to logic zero potential. The $CO_1$ and $CO_2$ terminals of A cell 217 are respectively coupled to the $CI_1$ and $CI_2$ terminals of C cell 218.

Figure 10:
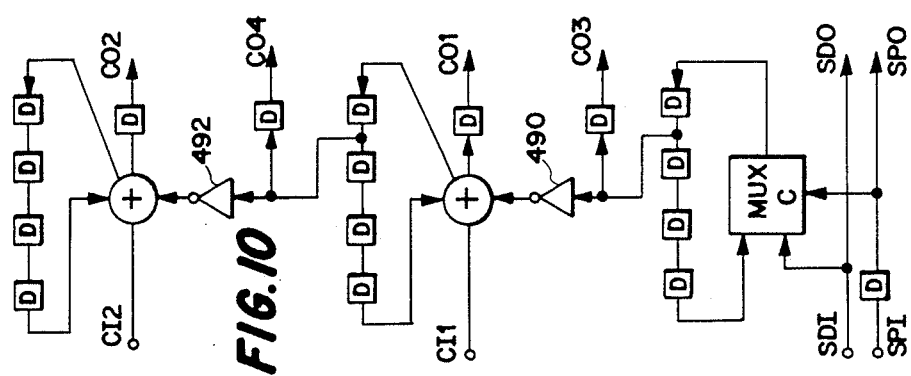

When a specific quantizer output value is a constant high logic value such as the "1" value applied to the QDI input of C cell 218, that C cell can be simplified to the circuitry illustrated in FIG. 10. In the simplification, a QDI terminal is not required and adders 156 and 452 are replaced by simple inverters (490 and 492). The reason this works is simply because adding a 1 to a logic value has the effect of complementing that value.

The circuit arrangement of FIG. 7 can also be used as a single loop modulator to process a time division multiplexed signal containing three distinct signals. In this instance the A and C cells will be similar to the cells illustrated in FIGS. 4 and 5 with the following exception. In FIG. 4, the delay elements 92 and 112 are eliminated and in FIG. 5 delay elements 170 and 154 are eliminated.

Referring to FIG. 3, the delay elements 48, 54 and 56 may be eliminated from the quantizer by changing the data output DO connection in cells 42 and 44. For example, in cell 44, the DO terminal will be connected to the output of delay element 166 (FIG. 5) and the DO terminal in cell 42 will be coupled to the output connection of delay element 168.

The FIG. 3 and 7 arrangements described may be used to process a single signal if the 35 bit input signal samples occur every 140 bit periods, i.e., every 4×35 bit periods. In this instance only one pulse converter is required.

What is claimed is:

1. Digital-to-analog conversion means comprising:
a signal input terminal for applying binary samples at a first rate;
sampled data sigma-delta modulator means, coupled to said signal input terminal, for resampling said binary samples to produce samples more coarsely quantized than said binary samples and at a rate greater than said first rate;
sample conversion means for converting said coarsely quantized samples into sequences of pulses, the number of pulses in a sequence being determined by amplitude values represented by said coarsely quantized samples; and
analog means for integrating/averaging said pulse sequences.

2. Digital-to-analog conversion means comprising:
a signal input terminal for applying bit-serial binary samples at a first sample rate;
sampled data sigma-delta modulator means, coupled to said signal input terminal, for resampling said bit-serial binary samples to produce samples more coarsely quantized than said bit-serial binary samples and at a greater rate than said first sample rate, said sigma-delta modulator including a plurality of one-bit serial accumulators interconnected to operate in a pipelined manner;
integrating/averaging means coupled to said sigma-delta modulator for generating an analog signal from said coarsely quantized samples.

3. The digital-to-analog conversion means set forth in claim 2 wherein said one bit serial accumulators include multiple delay elements to condition said accumulators to process a time division multiplexed signal.

4. The digital-to-analog conversion apparatus set forth in claim 2 wherein at least one of said one bit accumulators comprise:
a bit-serial signal input terminal;
an adder having addend, augend and carry input terminals, and carry output and sum output terminals;
first means, coupled between said sum output and said augend input terminals, for delaying sum output values synchronously with the occurrence of bits of said bit-serial signal and providing a delay period equal to an integral number of bit periods of said bit-serial signal;
second means, coupled between said bit-serial signal input terminal and said addend input terminal, for coupling a bit of a bit-serial input signal to said addend input terminal concurrently with said first means coupling a sum output value representing the same bit-serial input signal to said augend input terminal; and
wherein the plurality of accumulators are successively ordinally numbered and the carry output terminal of each ordinally numbered accumulator is coupled to the carry input terminal of the next higher ordinally numbered accumulator.

5. The digital-to-analog conversion apparatus set forth in claim 4 further including means for successively loading bits of said bit-serial signal into said plurality of accumulators during successive bit intervals, with bits of successively increasing significance being loaded into accumulators of successively increasing ordinal numbering.

6. The digital-to-analog conversion apparatus set forth in claim 5 wherein at least one of said plurality of one bit accumulators of higher ordinal numbering further include:
a QDI terminal for applying signal bits provided by a quantizer;
a further adder having addend, augend and carry input terminals, and a sum output and a carry output terminals;
means for coupling said further adder between said adder and said second means wherein the sum output terminal of said further adder is coupled to the addend input of said adder, the addend input of said further adder is coupled to the second means and the augend input of said further adder is coupled to said QDI terminal;
a data output terminal coupled to the sum output terminal of said adder; and wherein the interconnection of said higher ordinal numbered accumulators including said further adders includes a connection between the carry output of said further adder to the carry input terminal of said further adder of the next higher ordinally numbered accumulator.

7. The digital-to-analog conversion apparatus set forth in claim 6 wherein said sigma-delta modulator includes a quantizer which produces coarsely quantized samples of inverse polarity to samples applied to said sigma-delta modulator and respective bits of samples produced by said quantizer are coupled to respective QDI terminals of said higher ordinal numbered accumulators.

8. The digital-to-analog conversion apparatus set forth in claim 2 wherein said serial accumulators comprise:
a bit-serial signal input terminal;
first and second adders each having addend, augend and carry input terminals, and carry output and sum output terminals;
first delay means coupled between the sum output and augend input terminals of said first adder;
second delay means coupled between the sum output and augend input terminals of said second adder;
said first and second delay means for delaying sum output values synchronously with the occurrence of bits of said bit-serial signal and providing delays equal to an integral number of bit periods of said bit serial signal;
means, including storage means, coupled between said bit-serial signal input terminal and the addend input terminal of said first adder, for coupling a bit of a bit-serial input signal to the addend input terminal of said first adder concurrently with said first delay means coupling a sum output value representing the same bit-serial input signal to the augend input terminal of said first adder;
means for coupling the addend input terminal of said second adder to the sum output terminal of said first adder; and
wherein the plurality of accumulators are successively ordinally numbered and the carry output terminals of the first and second adders of each ordinally numbered accumulator are respectively coupled to the carry input terminals of the first and second adders of the next higher ordinally numbered accumulator.

9. The digital-to-analog conversion apparatus set forth in claim 8 wherein, for at least the higher ordinally numbered accumulators;
said means for coupling the addend input terminal of said second adder to the sum output terminal of said first adder includes a third adder having a sum output terminal coupled to the addend input of said second adder and having an addend input terminal coupled to the sum output terminal of said first adder, having carry input and output terminals, and having an augend input terminal coupled to a terminal QDI for receiving quantized data; and
wherein, said means including storage means, is coupled to said first adder and respective bits of samples produced by said quantizer are coupled to respective QDI terminals of said higher ordinal numbered accumulators.

10. The digital-to-analog conversion apparatus set forth in claim 9 wherein said sigma-delta modulator includes a quantizer which produces coarsely quantized samples of inverse polarity to samples applied to said sigma-delta modulator and respective bits of samples produced by said quantizer are coupled to respective ODI terminals of said higher ordinally numbered accumulators.

11. A pipelined sigma-delta modulator, comprising:
a bit-serial input terminal for receiving bit-serial data;
a plurality of first cells each cell including
an adder having first and second data input terminals, one bit carry input and output terminals and a one bit sum output terminal;
delay means coupled between said sum output terminal and said first input terminal;
a serial data input terminal; and
means including storage means coupled to said serial data input terminal for providing data to said second input terminal;
means for parallel connecting said plurality of first cells wherein said first cells are ordinally numbered and the carry output terminal of respective cells are coupled to the carry input terminal of the next higher ordinally numbered cell;
a plurality of second cells each of which includes:
first and second adders each including first and second data input terminals, carry input and output terminals and a sum output terminal;
delay means coupled between the sum output and first data input terminals of the first adder;
a data output terminal coupled to the sum output terminal of said first adder;
means for coupling the sum output terminal of the second adder to the second data input terminal of the first adder;
a quantized data input terminal coupled to the first data input terminal of the second adder;
a serial data input terminal; and
means including storage means coupled to said serial data input terminal for providing data to said second input terminal of said second adder;
means for parallel connecting said plurality of second cells wherein said second cells are ordinally numbered and the carry output terminals of said first and second adders of respective second cells are respectively coupled to the carry input terminals of the first and second adders of the next higher ordinally numbered cell;
means for coupling the carry output terminal of the highest ordinally numbered first cell to the carry input terminal of the first adder of the lowest ordinally numbered second cell;
means for coupling the data input terminals of said first and second cells to said bit-serial input terminal including means for coupling bits of said bit-serial signal of successively increasing significance respectively to cells of successively higher ordinal numbering.

12. The pipelined sigma-delta modulator set forth in claim 11 further including a quantizer coupled between the data output terminals of ones of said second cells and the quantized data input terminals of at least one of said ones of said second cells.

13. The sigma-delta modulator set forth in claim 11 wherein the means including storage means of said first and second cells includes:
a multiplexer having a first input terminal coupled to said data input terminal, having a second input and a control input terminal, and an output terminal;

further delay means coupled between said multiplexer output and second input terminal for providing a delay period equivalent to a delay period provided by said delay means; and means for coupling the output terminal of said multiplexer to said first adder with respect to said first cells, and to said second adder, with respect to said second cells.

14. Bit-serial processing apparatus comprising:

a bit-serial input terminal;

a first plurality of ordinally numbered cells, each cell including:
  a one bit accumulator having a data input, a carry input and a carry output terminal;
  means including storage means, having an input terminal and having an output terminal coupled to said data input terminal, for coupling signal to said accumulator;

means for interconnecting said first plurality of cells, wherein said carry output terminal of respective cells is coupled to the carry input terminal of the next higher ordinally numbered cell;

a second plurality of ordinally numbered cells, each cell including:
  a one bit accumulator having a data input, a carry input, a data output and a carry output terminal;
  combining means having an output coupled to the data input terminal of said accumulator, having first and second data input terminals, a carry input and a carry output terminal for arithmetically combining values applied to its first and second data input and carry input terminals;
  means, including storage means, having an output coupled to the first data input terminal of said combining means, and having an input coupled to said bit-serial input terminal for coupling signal to said combining means;

means for interconnecting said second plurality of cells wherein the carry output terminals of said accumulator and combining means of respective cells are respectively coupled to the carry input terminals of the accumulator and combining means of the next higher ordinally numbered cell;

means for coupling the carry output terminal of the highest ordinally numbered cell of said first plurality of cells to the carry input terminal of the accumulator of the lowest ordinally numbered cell of said second plurality of cells; and means for applying signal to the second data input terminals of the combining means of ones of said second plurality of cells.

15. The bit-serial processing apparatus set forth in claim 14 wherein said means for applying signal to the second data input terminals of the combining means comprises a quantizer having input connections coupled to the data output terminals of the accumulators of ones of the second plurality of cells.

* * * * *